(12) United States Patent
Tsen et al.

(10) Patent No.: US 8,169,019 B2
(45) Date of Patent: May 1, 2012

(54) METAL-OXIDE-SEMICONDUCTOR CHIP AND FABRICATION METHOD THEREOF

(75) Inventors: Kuo-Chang Tsen, Linkou Township, Taipei County (TW); Kao-Way Tu, Jhonghe (TW)

(73) Assignee: Niko Semiconductor Co., Ltd., Taipei (TW)

( * ) Notice: Subject to any disclaimer, the term of this patent is extended or adjusted under 35 U.S.C. 154(b) by 168 days.

(21) Appl. No.: 12/556,715

(22) Filed: Sep. 10, 2009

(65) Prior Publication Data

US 2011/0057254 A1  Mar. 10, 2011

(51) Int. Cl.
*H01L 29/66* (2006.01)
(52) U.S. Cl. ........ 257/328; 257/329; 257/619; 257/627; 438/212; 438/268; 438/459; 438/977
(58) Field of Classification Search .......... 257/328–329, 257/619–627
See application file for complete search history.

(56) References Cited

U.S. PATENT DOCUMENTS

| | | | | |
|---|---|---|---|---|
| 5,304,831 A * | 4/1994 | Yilmaz et al. | ................. | 257/341 |
| 5,614,751 A * | 3/1997 | Yilmaz et al. | ................. | 257/394 |
| 7,144,761 B2 * | 12/2006 | Nakagwa et al. | ............. | 438/118 |
| 7,192,805 B2 * | 3/2007 | Jobetto | ......................... | 438/114 |
| 7,368,799 B2 * | 5/2008 | Nagaoka | ....................... | 257/500 |
| 7,713,794 B2 * | 5/2010 | Iwamuro | ....................... | 438/140 |
| 7,884,390 B2 * | 2/2011 | Andrews et al. | .............. | 257/135 |
| 2002/0048889 A1 * | 4/2002 | Hayama et al. | ............... | 438/304 |
| 2003/0127702 A1 * | 7/2003 | Blair et al. | .................... | 257/510 |
| 2006/0086998 A1 * | 4/2006 | Nagaoka | ....................... | 257/500 |
| 2007/0145514 A1 * | 6/2007 | Kocon | .......................... | 257/488 |
| 2009/0117724 A1 * | 5/2009 | Iwamuro | ....................... | 438/586 |
| 2009/0173993 A1 * | 7/2009 | Andrews et al. | .............. | 257/330 |
| 2009/0309097 A1 * | 12/2009 | Hsieh | ............................. | 257/48 |
| 2010/0078719 A1 * | 4/2010 | Yoshida | ........................ | 257/334 |
| 2011/0018058 A1 * | 1/2011 | Disney | .......................... | 257/332 |
| 2011/0057254 A1 * | 3/2011 | Tsen et al. | .................... | 257/328 |
| 2011/0097894 A1 * | 4/2011 | Andrews et al. | .............. | 438/618 |

* cited by examiner

*Primary Examiner* — Eugene Lee
*Assistant Examiner* — Mohammed Shamsuzzaman
(74) *Attorney, Agent, or Firm* — Kile Goekjian Reed & McManus PLLC

(57) ABSTRACT

A metal-oxide-semiconductor chip having a semiconductor substrate, an epitaxial layer, at least a MOS cell, and a metal pattern layer is provided. The epitaxial layer is located on the semiconductor substrate and has an active region, a termination region, and a scribe line preserving region defined on an upper surface thereof. An etched sidewall of the epitaxial layer is located in the scribe line preserving region. The boundary portion of the upper surface of the semiconductor substrate is thus exposed. The MOS cell is located in the active region. The metal pattern layer is located on the epitaxial layer and has a gate pad coupled to the gate of the MOS cell, a source pad coupled to the source of the MOS cell, and a drain pattern, which is partly located on the upper surface of the semiconductor substrate.

17 Claims, 5 Drawing Sheets

METAL-OXIDE-SEMICONDUCTOR CHIP AND FABRICATION METHOD THEREOF

BACKGROUND OF THE INVENTION

1. Field of the Invention

This invention relates to a metal-oxide-semiconductor (MOS) chip and a fabrication method thereof and more particularly relates to a MOS chip featuring a vertical conduction current and a fabrication method thereof.

2. Description of Related Art

According to the direction of conduction current flow, the metal-oxide-semiconductor (MOS) devices can be sorted into planar type and vertical type. For the planar MOS device, the source and the drain are located on the same plane of the semiconductor base for generating a horizontal conduction current. Whereas, the source and the drain of the vertical MOS device are located on the opposing surfaces of the semiconductor base respectively and thus a vertical conduction current is generated.

For the planar MOS device, the withstanding voltage depends on the channel length between the source and the drain. Thus, the planar MOS device always needs a larger area on the semiconductor base for a greater withstanding voltage, which may hinder the improvement of cell density. In contrast, the withstanding voltage of the vertical MOS device depends mainly on the dopant concentration of the semiconductor base. The vertical MOS device can be sorted into the planar gate and the trenched gate according to the location of the gate, wherein the trenched-gate vertical MOS device with the gate electrode being formed in the trench on the semiconductor base is able to shrink the occupied area and is particularly good for increasing cell density.

FIG. 1 is a schematic view of a typical vertical MOS device. A trenched-gate MOS device is shown. As shown, the MOS device is formed on a semiconductor base 110. The semiconductor base 110 is composed of a semiconductor substrate 120 and a lightly-doped epitaxial layer 140 located on the semiconductor substrate 120. The lower surface of the semiconductor base 120 is covered with a metal layer 130 as the drain electrode of the MOS device. The epitaxial layer 140 has a trench 145 formed therein. The gate electrode 160 of the MOS device is located in the trench 145 and isolated from epitaxial layer 140 by a gate oxide layer 162 lining the trench 145. The well 150 is located by the gate electrode 160. The source doped regions 170 are located in the well 150 and electrically isolated from the gate electrode 160 through the gate oxide layer 162. The gate electrode 160 is covered by a dielectric layer 180. The source metal layer 190 is located on the epitaxial layer 140 and the dielectric layer 180 and is electrically connected to the source doped regions 170 and the well 150.

As mentioned, the source electrode and the gate electrode of the vertical MOS device are located on the upper surface of the semiconductor base 110, and the drain electrode thereof is located on the lower surface thereof. Therefore, the bonding pads for the source and the gate electrodes can be fabricated on the front side (the upper surface) of the chip, but the bonding pad for the drain electrode has to be formed on the back side (the lower surface), which results in the difficulty of packaging processes and restricts the applications of the chip.

SUMMARY OF THE INVENTION

It is an object of the present invention to provide a MOS chip with the gate electrode, the source electrode, and the drain electrode thereof being formed on the same side of the semiconductor base so as to facilitate the following packaging process as well as the application.

A metal-oxide-semiconductor (MOS) chip is provided in accordance with an embodiment of the present invention. The MOS chip has a heavily doped semiconductor substrate, an epitaxial layer, at least a MOS cell, and a metal pattern layer. The heavily doped semiconductor substrate composes a drain doped region. The epitaxial layer is located on the semiconductor substrate, and has an active region, a termination region, and a scribe line preserving region defined on an upper surface thereof. The epitaxial layer also has an etched sidewall in the scribed line preserving region extending to an upper surface of the semiconductor substrate. A boundary portion of the upper surface of the semiconductor substrate is thus exposed. The MOS cell having a gate electrode and a source electrode is located in the active region. The metal pattern layer is located on the epitaxial layer and the semiconductor substrate and has a gate pad, a source pad, and a drain pattern. The gate pad is electrically connected to a gate electrode of the MOS cell, the source pad is electrically connected to the source electrode of the MOS cell, and at least a portion of the drain pattern is located on the upper surface of the semiconductor substrate.

In accordance with another embodiment of the present invention, a fabrication method of the MOS chip is also provided. Firstly, a heavily doped semiconductor substrate is provided. Then, an epitaxial layer is formed on an upper surface of the semiconductor substrate. The epitaxial layer has a plurality of active regions, a plurality of termination regions, and a scribe line preserving region defined on the upper surface thereof, wherein the active regions are surrounded by the termination regions respectively, and the termination regions are surrounded by the scribe line preserving region. Afterward, a least one MOS cell with a gate electrode and a source electrode is formed in the active region. Thereafter, a deep trench is formed in the scribe line preserving region to expose a portion of the upper surface of the semiconductor substrate. Then, a metal pattern layer is formed on the epitaxial layer and the exposed semiconductor substrate. The metal pattern layer has at least a gate pad, a source pad, and a drain pattern, wherein the gate pad and the source pad are located in the active region and electrically connected to the gate electrode and the source electrode of the MOS cell respectively, and at least a portion of the drain pattern is located on the upper surface of the semiconductor substrate. Finally, a scribe line is formed along the scribe line preserving region to break the semiconductor substrate.

According to an embodiment of the present invention, the drain pattern extends from the upper surface of the epitaxial layer to the upper surface of the semiconductor substrate. According to another embodiment of the present invention, the whole drain pattern is located on the upper surface of the semiconductor substrate.

Because of the drain pattern formed on the upper surface of the semiconductor substrate by using the fabrication step of forming the source pad and the gate pad, the drain metal layer on the lower surface of the semiconductor substrate in the traditional MOS chip can be skipped and the cost can be reduced. In addition, the formation of the drain pattern on the upper surface also facilitates the following packaging and assembling processes.

Moreover, the conduction current flow of the traditional MOS chip is extended from the source electrode close to the upper surface of the epitaxial layer downward through the epitaxial layer and the semiconductor substrate to the drain metal layer on the lower surface of the semiconductor substrate. In contrast, although the conduction current flow of the MOS chip in accordance with the present invention is also extended form the source electrode close to the upper surface of the epitaxial layer downward, but the current flow is turned horizontal after passing through the epitaxial layer and is directed to the drain pattern on the boundary region of the upper surface of the semiconductor substrate. Especially for the small chip with similar width and thickness, the design of the MOS chip in accordance with the present invention is helpful for shrinking the distance between the source electrode and the drain electrode to reduce conduction loss.

BRIEF DESCRIPTION OF THE DRAWINGS

The present invention will now be specified with reference to its preferred embodiment illustrated in the drawings, in which.

DETAILED DESCRIPTION OF THE PREFERRED EMBODIMENTS

A MOS chip and a fabrication method thereof are provided in the present invention. The MOS chip is provided with a deep trench being formed at the scribe line preserved area to expose the heavily doped semiconductor substrate, so that the metal pattern layer formed on the semiconductor substrate in the following step can be electrically connected to the semiconductor substrate to achieve the object of allocating the drain electrode on the front surface of the chip.

Figure 1:
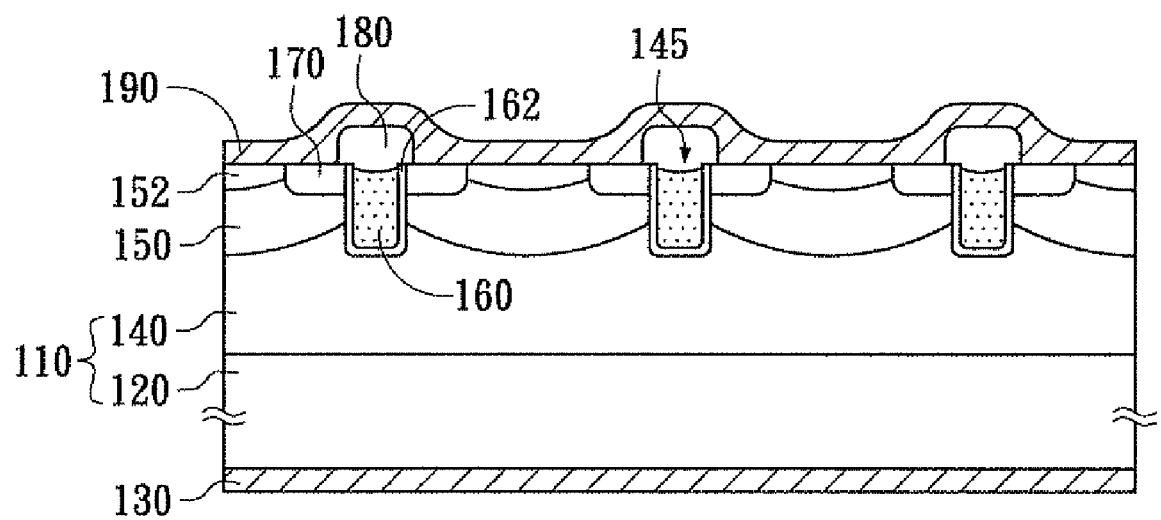
FIG. 1 is a schematic view of a typical vertical MOS device.
Figure 2A:
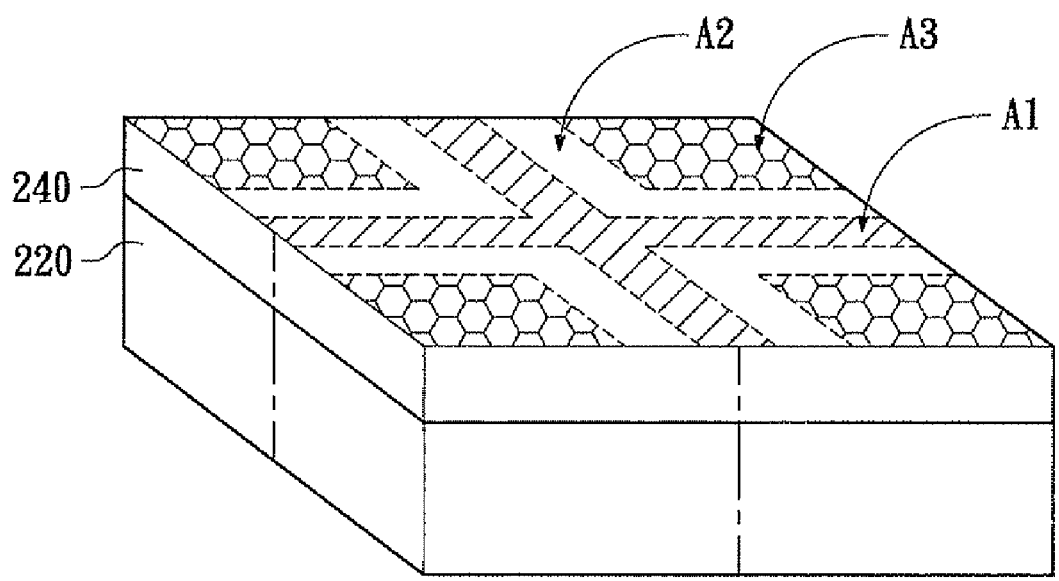
FIGS. 2A to 2E are schematic views showing a fabrication method of a metal-oxide-semiconductor chip in accordance with a preferred embodiment of the present invention.

FIGS. 2A to 2E are schematic views showing a fabrication method of a metal-oxide-semiconductor (MOS) chip in accordance with a first embodiment of the present invention. As shown in FIG. 2A, firstly, a heavily doped semiconductor substrate 220 is provided and an epitaxial layer 240 is formed on the upper surface of the semiconductor substrate 220. The conductive type of the epitaxial layer 240 is identical to that of the semiconductor substrate 220, but the dopant concentration of the epitaxial layer 240 is much lower. A plurality of active regions A3, a plurality of termination regions A2, and a scribe line preserving region are defined on the upper surface of the epitaxial layer 240. As shown, the active regions A3 are arranged in an array and surrounded by the respective termination region A2. The termination regions A2, which substantially define the area of each chip on the wafer, are surrounded by the scribe line preserving region A1. The space of the scribe line preserving region A1 is preserved for the following wafer breaking process.

Figure 2B:
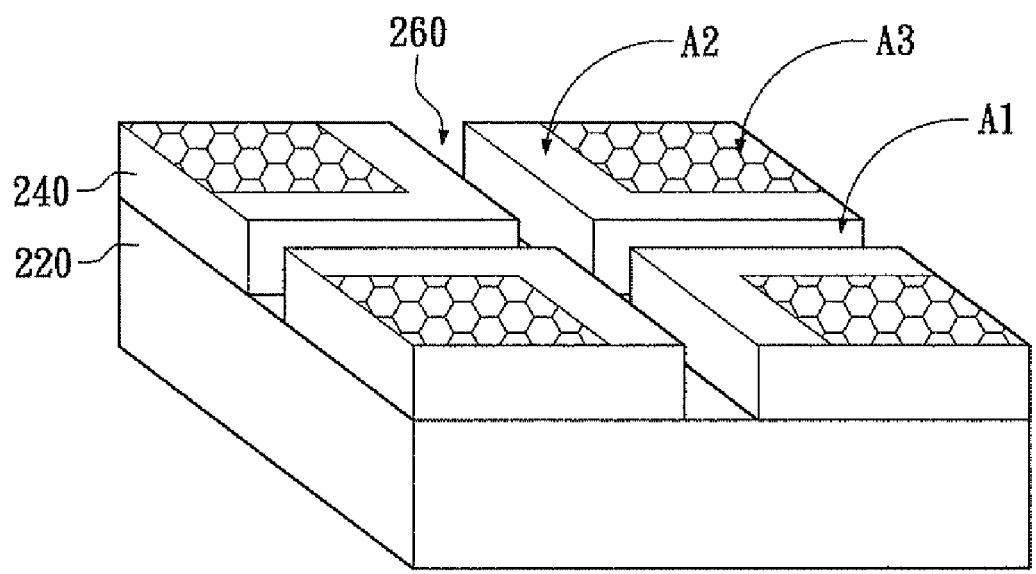

Thereafter, at least a MOS cell is formed in the active region A3 on the epitaxial layer 240. The MOS cell (not shown) has a gate electrode and a source electrode. The fabrication steps of forming the MOS cell may adopt the ordinary trenched or planar MOS device fabrication method. Then, as shown in FIG. 2B, at least a deep trench 260 is formed in the scribe line preserving region A1 to expose at least a portion of the upper surface of the semiconductor substrate 220. The width of the deep trench 260 can be adjusted according to the need. In the present embodiment, the width of the deep trench 260 is close to the width of the scribe line preserving region A1.

Figure 2C:
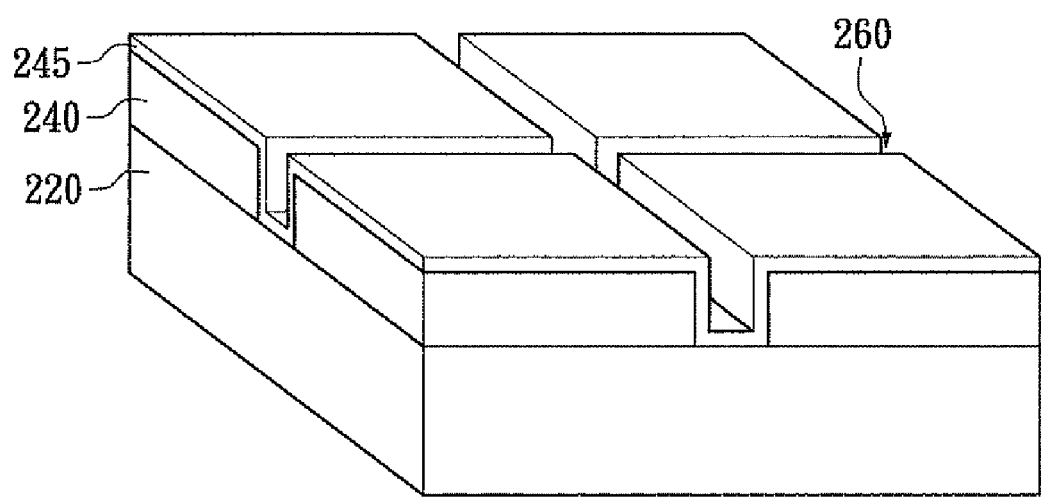

Afterward, as shown in FIG. 2C, a metal layer 245 is formed on the epitaxial layer 240 and the semiconductor substrate 220. The metal is extended along the surface profile of the epitaxial layer 240 and the exposed semiconductor substrate 220. Then, as shown in FIG. 2D, a portion of the metal layer 245 right above the epitaxial layer 240 is removed by lithographic and etching steps so as to form a metal pattern layer 250 on the exposed epitaxial layer 240 and the semiconductor substrate 220.

As shown, the metal pattern layer 250 has at least a gate pad 252, at least a source pad 254, and at least a drain pattern 255. The gate pad 252 and the source pad 254 are located in the active region A3 and electrically connected to the source electrode and the gate electrode of the MOS cell therebelow respectively. In addition, at least a portion of the drain pattern 255 is located on the upper surface of the semiconductor substrate 220 adjacent to the sidewall of the epitaxial layer 240 for electrically connecting to the semiconductor substrate 220.

Figure 2D:
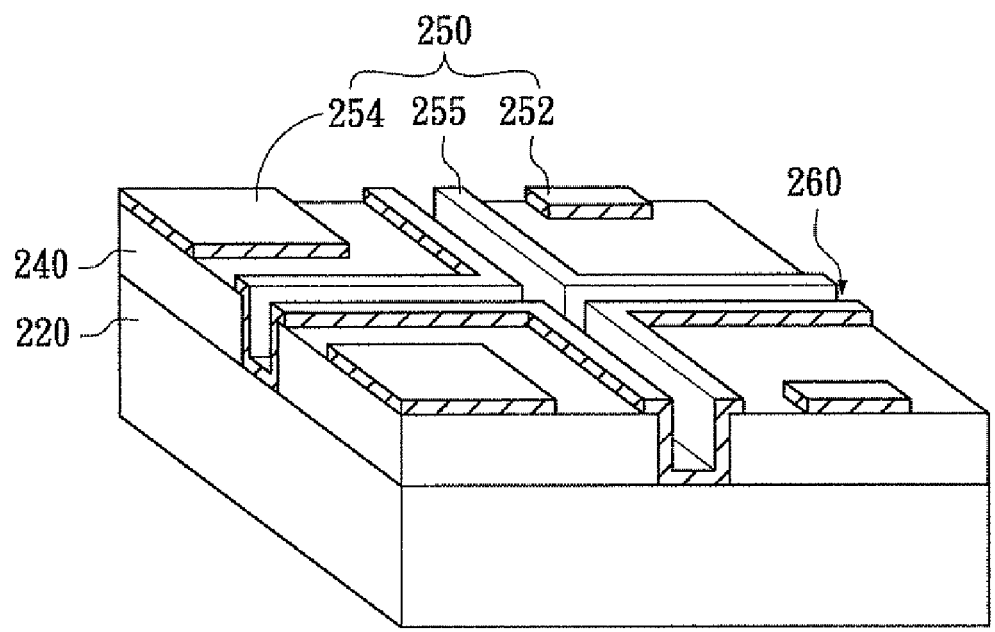

As shown in FIG. 2D, in the present embodiment, only a portion of the metal layer 245 right above the epitaxial layer 240 is removed and the portion covering the upper surface of the semiconductor substrate 220 and the sidewall of the epitaxial layer 240 is left as the drain pattern 255. However, the present invention is not so restricted. The portion of the metal layer 245 covering the upper surface of the semiconductor substrate 220 and the sidewall of the epitaxial layer 240 can be partially removed according to the need.

Moreover, a drain pad (not shown) for supplying drain voltage can be defined in the drain pattern 255 by using the above mentioned fabrication step for forming the metal pattern layer 250. The drain pad may be located on the upper surface of the semiconductor substrate 220 or on the upper surface of the epitaxial layer 240 according to the actual need.

In contrast with the traditional MOS chips which needs a drain metal layer formed on the lower surface of the semiconductor substrate for supplying drain voltage, the present embodiment features the drain pattern 255 formed on the upper surface of the semiconductor substrate 220 or the epitaxial layer 240. Thus, the drain metal layer can be skipped and the lower surface of the semiconductor substrate may be further covered with an insulating layer (not shown).

Figure 2E:
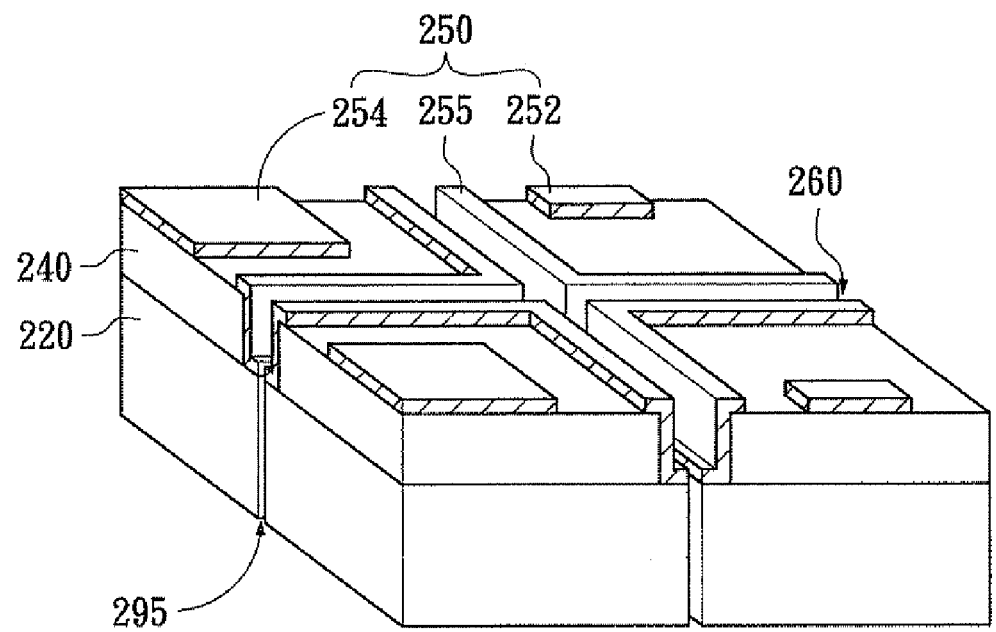

Thereafter, as shown in FIG. 2E, the semiconductor substrate 220 is broken into pieces through the scribe line 295 formed along the scribe line preserving region A3. The width of the deep trench 260 in the step of FIG. 2B is greater than the width of the scribe line 295 to leave a space on the upper surface of the semiconductor substrate 220 for locating the drain pattern 255.

As mentioned above, because of the formation of the drain pattern 255 on the upper surface of the semiconductor substrate 220, the drain metal layer of the traditional MOS chip can be skipped. In addition, as shown in FIGS. 2C and 2D, the drain pattern 255 can be defined by using the lithographic step for defining the source pad 254 and the gate pad 252. Thus, the present embodiment does not need additional lithographic and etching steps solely for defining the drain pattern 255. Moreover, there must be the scribe line preserving region A1 on the wafer preserved for the wafer breaking step. The fabrication method provided in the present embodiment adopts the space of the scribe line preserving region A1 for locating the drain pattern 255 would not waste the space of the active region on the chip. Therefore, the space on the chip can be used effectively and the material cost can be reduced.

Figure 3A:
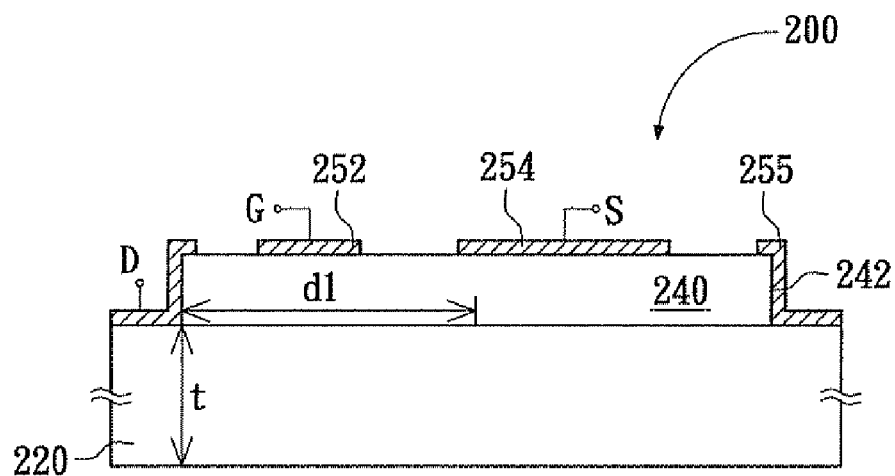
FIGS. 3A and 3B are cross-section view and top view of a MOS chip in accordance with a preferred embodiment of the present invention.
Figure 3B:
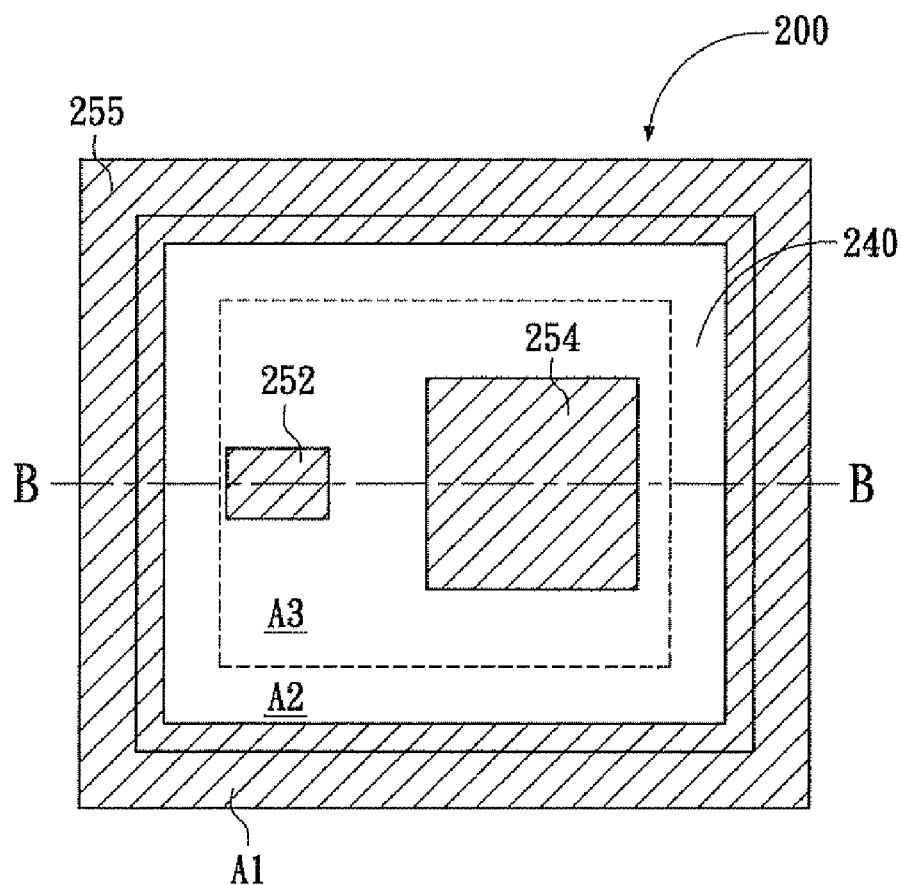

FIGS. 3A and 3B are cross-section view and top view of a MOS chip in accordance with a preferred embodiment of the present invention, wherein FIG. 3A is corresponding to the cross-section B-B in FIG. 3B. As shown in FIG. 3A, the MOS chip 200 has a heavily doped semiconductor substrate 220, an epitaxial layer 240, at least a MOS cell (not shown), and a metal pattern layer 250. The heavily doped semiconductor substrate 220 composes a drain doped region. The edge of the semiconductor substrate 220 of the chip 200 is defined by scribe line. The epitaxial layer 240 is located on the semiconductor substrate 220.

Also referring to FIG. 3B, an active region A3, a termination region A2, and a scribe line preserving region A1 is defined on the upper surface of the epitaxial layer 240. The active region A3 is surrounded by the termination region A2, and the termination region A2 is surrounded by the scribe line preserving region A1. The etched sidewall 242 of the epitaxial layer 240 is located in the scribe line preserving region A1 and extended to the upper surface of the semiconductor substrate 220 so that a ladder-shaped structure is shown near the edge of the semiconductor substrate 220 and the boundary region of the upper surface of the semiconductor substrate 220 is exposed.

The MOS cell is located in the active region A3. The metal pattern layer 250 is located on the epitaxial layer 240 and the semiconductor substrate 220. The metal pattern layer 250 has a gate pad 252, a source pad 254, and a drain pattern 255. The gate pad 254 is electrically connected to the gate electrode of the MOS cell, the source pad 254 is electrically connected to the source electrode of the MOS cell, and at least a portion of the drain pattern 255 is located on the upper surface of the semiconductor substrate 220.

The MOS cell is located in the active region A3. The metal pattern layer 250 is located on the epitaxial layer 240 and the semiconductor substrate 220. The metal pattern layer 250 has a gate pad 252, a source pad 254, and a drain pattern 255. The gate pad 252 is electrically connected to the gate electrode of the MOS cell, the source pad 254 is electrically connected to the source electrode of the MOS cell, and at least a portion of the drain pattern 255 is located on the upper surface of the semiconductor substrate 220.

As shown in FIG. 3B, the drain pattern 255 in the present embodiment is located outside the termination region A2 and is extended from the upper surface of the epitaxial layer 240, through the sidewall of the deep trench 260, to the upper surface of the semiconductor substrate 220. It is noted that, the drain pattern 255 should be located outside the termination region A2 and away from the active region A3 so as to prevent the operation of the cells in the active region A3 from being disturbed by the signals on the drain pattern 255.

Figure 4:
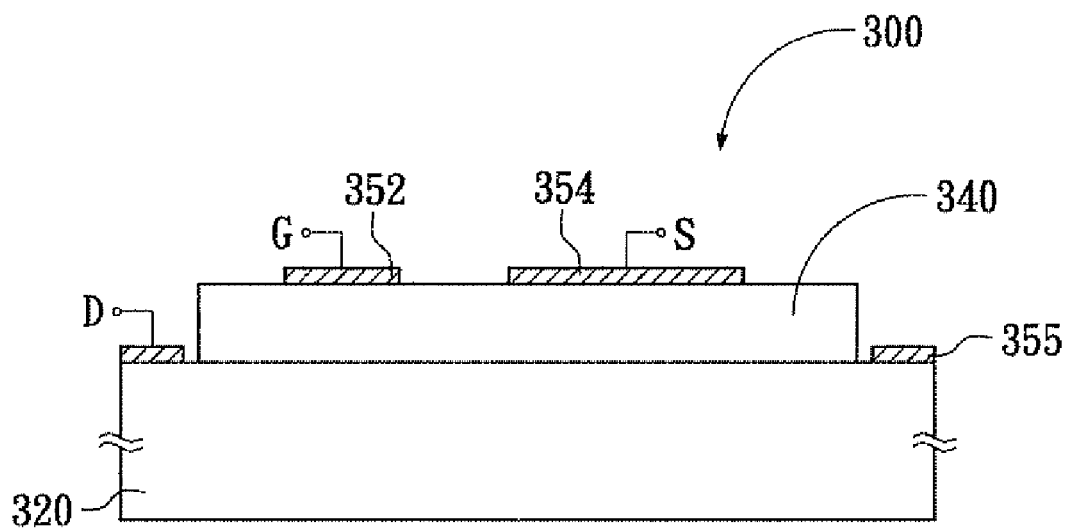
FIG. 4 is a cross-section view of a MOS chip in accordance with another embodiment of the present invention.

In addition, referring to FIG. 3B, in the present embodiment, the whole termination region A2 is surrounded by the drain pattern 255, and the drain pattern 255 is extended from the upper surface of the epitaxial layer 240 to the semiconductor substrate 220. However, the present invention is not so restricted. As shown in FIG. 4, the whole drain pattern 355 may be located on the upper surface of the semiconductor substrate 320, or with only a portion extended to the upper surface of the epitaxial layer 340.

The MOS chips 200 and 300 in accordance with the present invention feature the drain patterns 255 and 355 on the upper surface of the semiconductor substrate and the epitaxial layer for supplying drain voltage. Thus, the drain metal layer on the lower surface of the semiconductor substrate is not needed in the present invention. In addition, the conduction current flow in the traditional MOS chip is extended from the source electrode close to the upper surface of the epitaxial layer downward through the epitaxial layer and the semiconductor substrate. In contrast, although the conduction current flow of the MOS chip in accordance with the present invention is also extended from the source electrode close to the upper surface of the epitaxial layer 240 downward, the conduction current flow is turned horizontal right below the epitaxial layer 240 and directed to the drain pattern 255 on the boundary region of the upper surface of the semiconductor substrate 220.

For a small chip with similar width and thickness, a distance dl between the center and the edge of the epitaxial layer 240 may be smaller than a thickness t of the semiconductor substrate 220. That is, the distance between the center of the active region A3 and the scribe line preserving region A1 may be smaller than the thickness of the semiconductor substrate 220, 320. Under such circumstance, in contrast with the traditional MOS chip, which has a drain metal layer located on the lower surface of the semiconductor substrate, the current path from the source electrode to the drain pattern 255 located on the boundary region of the upper surface of the semiconductor substrate 220 would be shorter. Thus, for small chip application, conduction loss can be effectively reduced.

Figure 5:
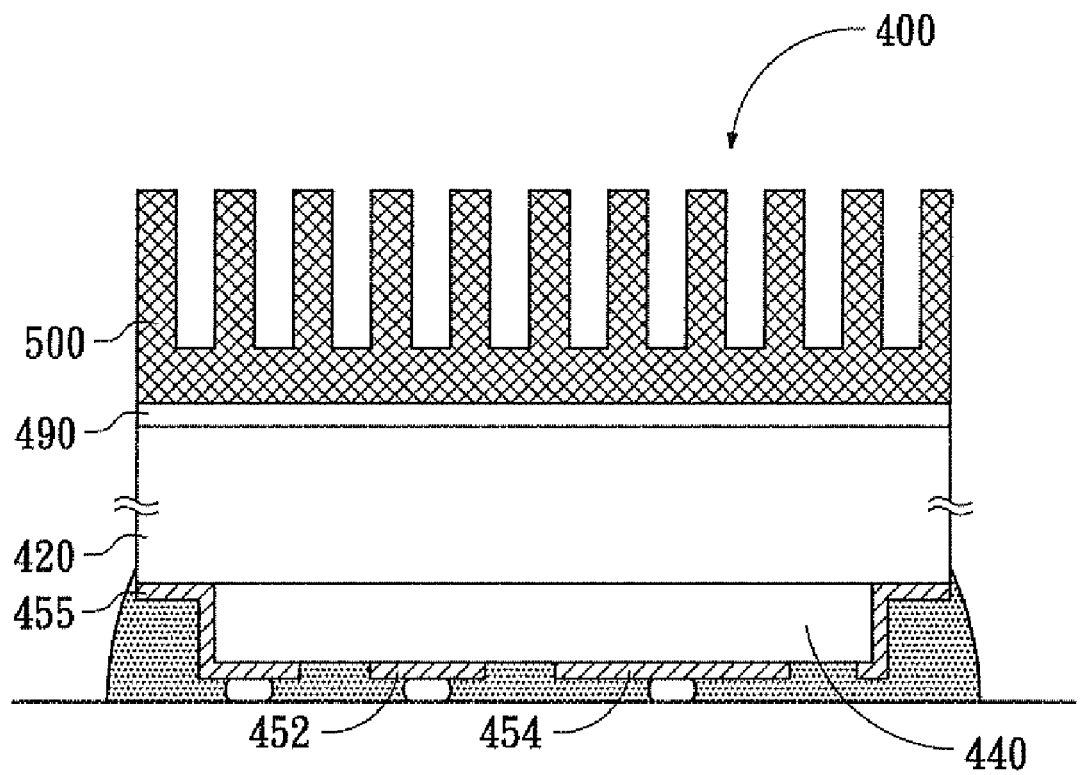
FIG. 5 is a cross-section view of a MOS chip in accordance with still another embodiment of the present invention.

As shown, the gate pad, the source pad, and the drain pattern are located at the same side of the metal-oxide-semiconductor chip 200,300,400, and the other side of the metal-oxide-semiconductor chip 200,300,400 is exposed. Thus, as shown in FIG. 5, a thermal dissipation structure 500 may be assembled to the semiconductor substrate 420 through an insulating layer 490 to lower down the operation temperature of the MOS chip 400 and enhance the operation efficiency. The MOS chip 400 may be flip-chip packaged to have the gate pad 452, the source pad 454, and the drain pattern 455 electrically coupled to the printed circuit board (not shown). The heat generated by the MOS chip can be dissipated through the epitaxial layer 440 and the semiconductor substrate 420 and released from the thermal dissipation structure 500.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A metal oxide semiconductor (MOS) chip, comprising:
a heavily doped semiconductor substrate, composing a drain doped region;
an epitaxial layer, which is located on the semiconductor substrate and has an etched sidewall formed on a scribe line preserving region of the MOS chip such that the scribe line preserving region has a first portion defined on the epitaxial layer perpendicular to an upper surface of the semiconductor substrate and a second portion defined on the upper surface of the semiconductor substrate, the epitaxial layer also having an active region, and a termination region surrounding the active region and being surrounded by the scribe line preserving region, wherein the upper surface of the semiconductor substrate defined by the second portion of the scribe line preserving region is exposed;
at least a MOS cell, located in the active region and having a gate electrode and a source electrode; and
a metal pattern layer, formed on the epitaxial layer and the exposed upper surface of the semiconductor substrate defined by the second portion of the scribe line preserving region, the metal pattern layer having a gate pad, a source pad, and a drain pattern, wherein the gate pad is electrically connected to the gate electrode of the MOS cell, the source pad is electrically connected to the source electrode of the MOS cell, and the drain pattern is formed on the scribe line preserving region such that a first portion of the drain pattern is defined on the epitaxial layer perpendicular to the upper surface of the semiconductor substrate, and a second portion of the drain pattern is defined on the upper surface of the semiconductor substrate.

2. The metal-oxide-semiconductor chip of claim 1, wherein the drain pattern is extended from the upper surface of the epitaxial layer to the upper surface of the semiconductor substrate.

3. The metal-oxide-semiconductor chip of claim 1, wherein the whole drain pattern is located on the upper surface of the semiconductor substrate.

4. The metal-oxide-semiconductor chip of claim 1, wherein the drain pattern is located outside the termination region.

5. The metal-oxide-semiconductor chip of claim 1, further comprising an insulating layer located on a lower surface of the semiconductor substrate.

6. The metal-oxide-semiconductor chip of claim 5, further comprising a thermal dissipation metallic structure located below the insulating layer.

7. The metal-oxide-semiconductor chip of claim 1, wherein a distance between a center of the epitaxial layer to an edge of the epitaxial layer is no greater than a thickness of the semiconductor substrate.

8. The metal-oxide-semiconductor chip of claim 1, wherein the epitaxial layer has a conduction type identical to that of the semiconductor substrate but has a lower dopant concentration.

9. A fabrication method of a metal-oxide-semiconductor chip, comprising the steps of:

providing a heavily doped semiconductor substrate;

forming an epitaxial layer on an upper surface of the semiconductor substrate, the epitaxial layer having a plurality of active regions, a plurality of termination regions surrounding the active regions and a scribe line preserving region defined on an upper surface thereof and surrounding the termination regions, wherein the epitaxial layer has an etched sidewall formed on the scribe line preserving region such that the scribe line preserving region has a first portion defined on the epitaxial layer perpendicular to the upper surface of the semiconductor substrate and a second portion defined on the upper surface of the semiconductor substrate, with the upper surface of the semiconductor substrate defined by the second portion of the scribe line preserving region being exposed by having a deep trench formed in the scribe line preserving region;

forming a least one MOS cell in the active region, the MOS cell having a gate electrode and a source electrode;

forming a metal layer on the epitaxial layer; and forming a metal pattern layer on the epitaxial layer and the exposed portion of the upper surface of the semiconductor substrate defined by the second portion of the scribe line preserving region, the metal pattern layer having at least a gate pad, a source pad, and a drain pattern, wherein the gate pad and the source pad are located in the active region and electrically connected to the gate electrode and the source electrode of the MOS cell, respectively, and the drain pattern is formed on the scribe line preserving region such that a first portion of the drain pattern is defined on the epitaxial layer perpendicular to the upper surface of the semiconductor substrate, and a second portion of the drain pattern is defined on the upper surface of the semiconductor substrate.

10. The fabrication method of the metal-oxide-semiconductor chip of claim 9, wherein a portion of the metal layer on the semiconductor substrate is also removed in the step of removing the portion of the metal layer on the epitaxial layer.

11. The fabrication method of the metal-oxide-semiconductor chip of claim 9, wherein a width of the deep trench is greater than that of the scribe line.

12. The fabrication method of the metal-oxide-semiconductor chip of claim 9, wherein the active regions are arranged on the upper surface of the epitaxial layer in array.

13. The fabrication method of the metal-oxide-semiconductor chip of claim 9, wherein the drain pattern extends from the upper surface of the epitaxial layer to the upper surface of the semiconductor substrate.

14. The fabrication method of the metal-oxide-semiconductor chip of claim 9, wherein the whole drain pattern is located on the upper surface of the semiconductor substrate.

15. The fabrication method of metal-oxide-semiconductor chip of claim 9, wherein the drain pattern is located outside the termination region.

16. The fabrication method of the metal-oxide-semiconductor chip of claim 9 further comprising forming an insulating layer on a lower surface of the semiconductor substrate.

17. The fabrication method of the metal-oxide-semiconductor chip of claim 9, wherein a distance between the scribe line preserving region and a center of the active region is smaller than a thickness of the semiconductor substrate.

* * * * *